(12) United States Patent
Yokota

(10) Patent No.: US 6,400,205 B1
(45) Date of Patent: Jun. 4, 2002

(54) DIODE DETECTION CIRCUIT

(75) Inventor: Yasuhiro Yokota, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/840,387

(22) Filed: Apr. 23, 2001

(30) Foreign Application Priority Data

Dec. 12, 2000 (JP) ............................................ 12-377421

(51) Int. Cl.$^7$ .............................. H03K 5/08; H03L 5/00
(52) U.S. Cl. ...................... 327/330; 327/184; 327/531; 327/104
(58) Field of Search ................................. 327/330, 104, 327/184, 531–533, 172, 299, 302, 303, 58–62

(56) References Cited

U.S. PATENT DOCUMENTS 5,801,552 A * 9/1998 Moore .......................... 327/62
5,821,790 A * 10/1998 Sweetman .................. 327/184
6,310,682 B1 * 10/2001 Gavish et al. ............. 356/5.01

FOREIGN PATENT DOCUMENTS

JP 07-111421 4/1995
JP 11-261341 9/1999

* cited by examiner

Primary Examiner—Toan Tran
Assistant Examiner—Long Nguyen
(74) Attorney, Agent, or Firm—Rosenman & Colin LLP

(57) ABSTRACT

A diode detection circuit is capable of obtaining an ideal rectification voltage even the case of a minute input high-frequency voltage. The circuit includes a first diode that accepts an AC signal; a first parallel circuit consisting of a resistor and a capacitor, the first parallel circuit accepting a detection output from the first diode; a first operational amplifier having a positive input terminal that accepts a charging voltage for the capacitor of the first parallel circuit; a second diode that accepts an output from the first operational amplifier; a first switching circuit consisting of a first switch and an oscillator, the first switching circuit providing a control of the ratio of conduction to non-conduction of the first and second diodes; a second parallel circuit consisting of a resistor and a capacitor, the second parallel circuit accepting an output from the first switching circuit.

7 Claims, 7 Drawing Sheets

DIODE DETECTION CIRCUIT

BACKGROUND OF THE INVENTION

1. Field of the Invention

The present invention relates generally to a diode detection circuit, and more particularly, to a diode detection circuit suited for high frequency signal detection.

2. Description of the Related Art

Figure 1:
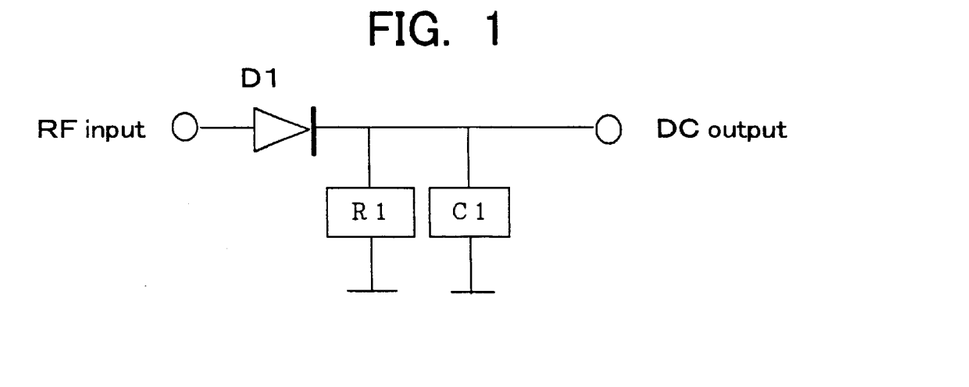
FIG. 1 is a diagram showing a conventional diode detection circuit.

Detection circuits or rectifiers using diodes are known. FIG. 1 depicts an example of the configuration thereof. A parallel circuit consists of a resistor R1 and a capacitor C1 and is connected to the cathode side of a diode D1.

When an input signal has a small high-frequency voltage level such as in the case where a diode detection circuit of FIG. 1 is used to detect the high-frequency signal level between cellular phones and base stations, the forward voltage drop of the diode D1 will become unnegligible.

That is, the input high-frequency voltage is sagged (voltage dropped) by the forward voltage of the diode D1 and is output across the resistor R1. Due to the nonlinearity in the voltage-current characteristics of the diode D1, the detection linearity may become degraded in the minute high-frequency voltage area such as the high-frequency signals between the cellular phones and the base stations.

In addition, the influences of the temperature characteristics of the diode D1 may cause a large temperature variation in the detection characteristics. The forward voltage fluctuations attributable to the temperature variations may vary depending on the temperature at the rate of about −2 mV/° C., and hence −100 mV output voltage fluctuation will occur by variation of 50° C.

Figure 2:
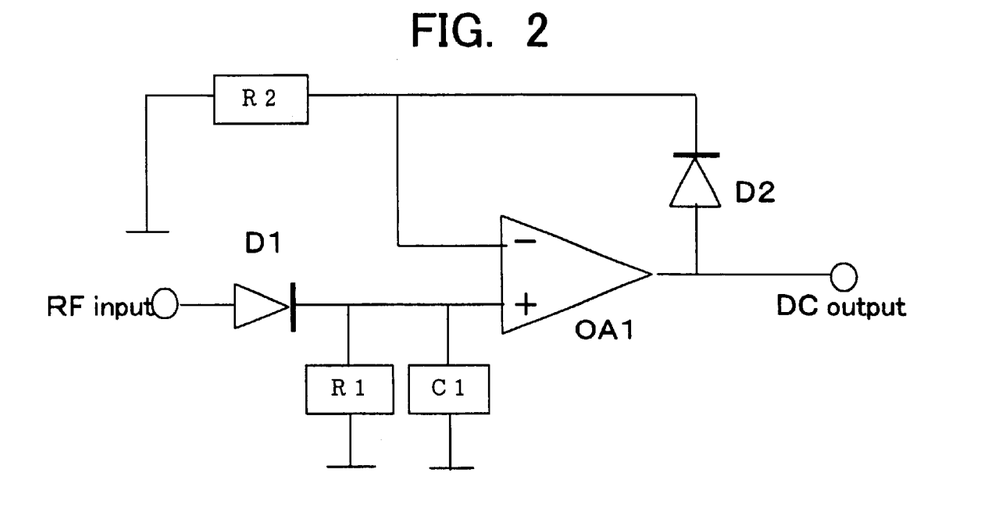
FIG. 2 is a diagram showing a conventional diode-using ideal diode detection circuit.

Thus, a diode detection circuit of FIG. 2 having improved detection linearity and temperature variations was proposed ("Diode Detection Circuit" disclosed in Japan Patent Laid-open Pub. No. Hei7-111421). The diode detection circuit of FIG. 2 is configured so that an operational amplifier OA1 offsets the voltage drop and fluctuations of the detection diode D1 by the voltage drop and fluctuations of a compensation diode D2.

The detection diode D1 and the compensation diode D2 are correlated with resistors R1 and R2, respectively, so that the ratio of the resistor R1 to the resistor R2 conforms to the ratio of the saturation current value of the detection diode D1 to the saturation current value of the compensation diode D2. This allows different types of diodes to be used as the diodes D1 and D2.

Figure 3:
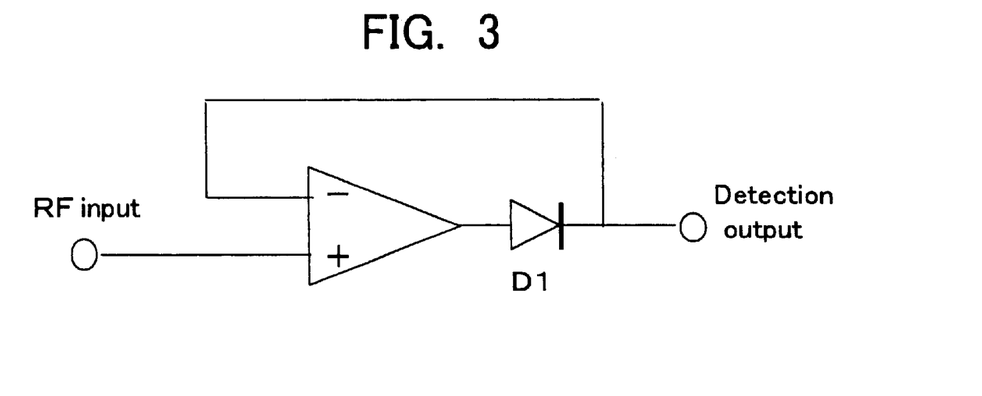
FIG. 3 is a diagram showing another conventional diode-using diode detection circuit.

FIG. 3 shows another diode detection circuit in which the operational amplifier OA1 is disposed on the input side of the detection diode D1, with the output of the detection diode D1 being fed back to the negative input of the operational amplifier OA1 to allow an action as the diode D1 with zero forward voltage. It is to be noted that if the FIG. 3 circuit remains unvaried, the circuit output is given in the form of a pulsation current. Similar to the examples of FIGS. 1 and 2, the addition of the capacitor to the output side enables the high-frequency voltage peak value to be held.

The above circuit of FIG. 2 aims to relieve the voltage drop and temperature variations of the diode D1 by rectifying the high-frequency voltage by the diode D1 and thereafter correcting it by the operational amplifier OA1 and the diode D2.

Figure 4:
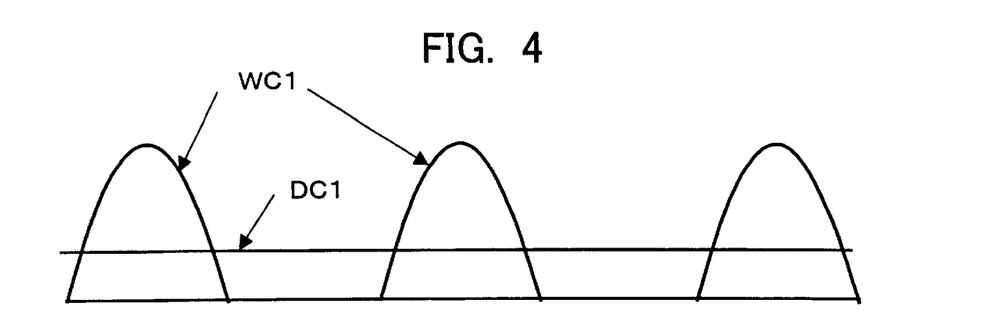
FIG. 4 is a diagram showing the relationship between the half-wave rectification (pulsating current) and direct current.

In this circuit, however, as shown in FIG. 4, when the diode D1 rectifies the high-frequency signals, only a half-cycle current WC1 flows therethrough whereas the diode D2 allows a flow of direct current DC1 therethrough. Thus, the diodes D1 and D2 make remarkably different dynamic actions.

Figure 5:
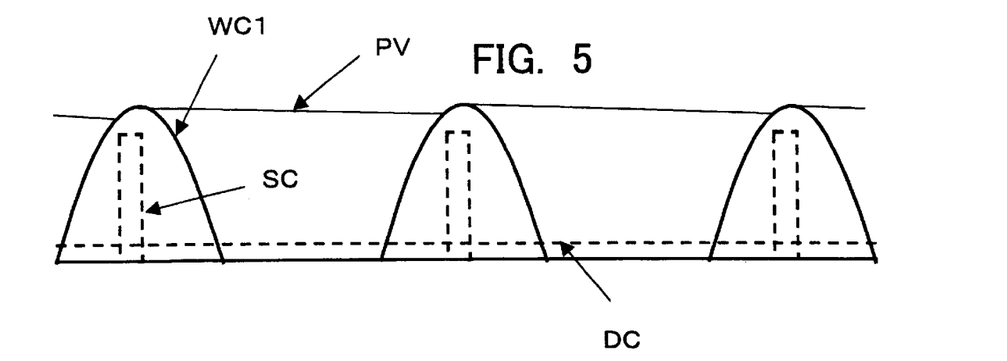
FIG. 5 is a diagram showing the relationship between the AC voltage and the surge current.

As is apparent from FIG. 5 showing the relationship between the high-frequency voltage WC1 and the surge current SC, in case of the capacitor input detection circuit as depicted in FIG. 2, the surge current SC flows through the diode D1 for a brief period of time near the peak value of the high-frequency voltage, to charge the capacitor C1. Then, gradual discharge is made till the next half cycle (PV in the diagram), and again the charging is effected near the next peak value. These operations are iterated. Accordingly as the mean value of the DC voltage becomes closer to the peak value of the AC voltage WC1, the time during which the surge current flows will decrease and the ratio of the surge current SC to the mean direct current becomes larger.

The time rate during which the surge current SC flows depends on the product of the internal resistance of the diode D1 and the cathode side external capacitance, and will be of the order of $\frac{1}{20}$ of one cycle. The direct current DC flowing through the diode 2 is about $\frac{1}{12}$ of the surge current SC.

Therefore, irrespective of the same internal resistances of the diodes D1 and D2, there lies a large difference between the surge current SC and the direct current DC flowing therethrough, with the result that the diodes D1 and D2 may disadvantageously suffer different forward voltages.

Another problem lies in that it is difficult to faithfully provide the input high-frequency voltage peak value PV as the DC output.

On the contrary, the circuit of FIG. 3 is a circuit which is introduced as an ideal diode detection (rectification) circuit, although the high-frequency signals must be amplified by the operational amplifier OA1 since the output of the operational amplifier OA1 is rectified by the diode D1. It may suffer a further drawback that the operational amplifier OA1 must have an enough higher (ten times or more) bandwidth than the high-frequency signal to be rectified from the viewpoint of through-rate.

Naturally, good performance of the operational amplifier OA1 may merely result in an ideal circuit of FIG. 3. It may not be easy however even to make gain amplification at a high high-frequency voltage of 1 to 2 GHz. In addition, amplification of the high high-frequency voltage of 10 to 20 Ghz with a high gain will lead to significantly increased costs.

As discussed above, the conventional example circuits of FIGS. 2 and 3 tend to suffer the above respective deficiencies.

SUMMARY OF THE INVENTION

It is therefore the object of the present invention to solve the above problem involved in the conventional diode detection circuit and to provide a diode detection circuit capable of obtaining an ideal rectification voltage even in the case of a minute input high-frequency voltage.

In order to achieve the above object, according to an aspect of the present invention there is provided a diode detection circuit comprising a first diode that accepts an AC signal; a first parallel circuit consisting of a resistor and a capacitor, the first parallel circuit accepting a detection output from the first diode; a first operational amplifier having a positive input terminal that accepts a charging voltage for the capacitor of the first parallel circuit; a second diode that accepts an output from the first operational amplifier; a first switching circuit consisting of a first switch and an oscillator, the first switching circuit providing a control of the ratio of conduction to non-conduction of the first and second diodes; a second parallel circuit consisting of a resistor and a capacitor, the second parallel circuit accepting an output from the first switching circuit, with a charging voltage for the capacitor of the second parallel circuit being applied to a negative input terminal of the first operational amplifier; and a holding circuit that holds an output from the first operational amplifier.

Preferably, the diode detection circuit further comprises a second switching circuit disposed on the input side of the holding circuit, the second switching circuit effecting its switching operations alternately with the first switching circuit, and the holding circuit holds a positive peak value of the output from the first operational amplifier.

Preferably, in the diode detection circuit, the holding circuit holds a negative peak value of the output from the first operational amplifier. Preferably, the diode detection circuit further comprises a positive power source exceeding in the forward direction of the first diode.

Preferably, the diode detection circuit further comprises a negative power source connected to a positive input terminal of the first operational amplifier, the negative power source exceeding in the forward direction of the first diode.

Preferably, the first switching circuit approximates the second diode conduction time to the first diode conduction time.

Preferably, the resistors of the first and second parallel circuits have the same resistance value or approximate resistance values, and the ratio of the peak value of the charging current to the mean value of the discharging current of the first diode conforms to the ratio of the peak value of the charging current to the mean value of the discharging current of the second diode by causing the product of the resistor, capacitor and the input frequency of the first parallel circuit to conform to the product of the resistor, capacitor and the oscillator frequency of the second parallel circuit.

The above and other objects, aspects, features and advantages of the present invention will become more apparent from the embodiments of the present invention which will be described in conjunction with the accompanying drawings.

DESCRIPTION OF THE PREFERRED EMBODIMENTS

Preferred embodiments of the present invention will now be described with reference to the accompanying drawings. It is to be noted that the shown embodiments are given for illustrative purposes only and are not intended to limit the application of the present invention thereto.

Figure 6:
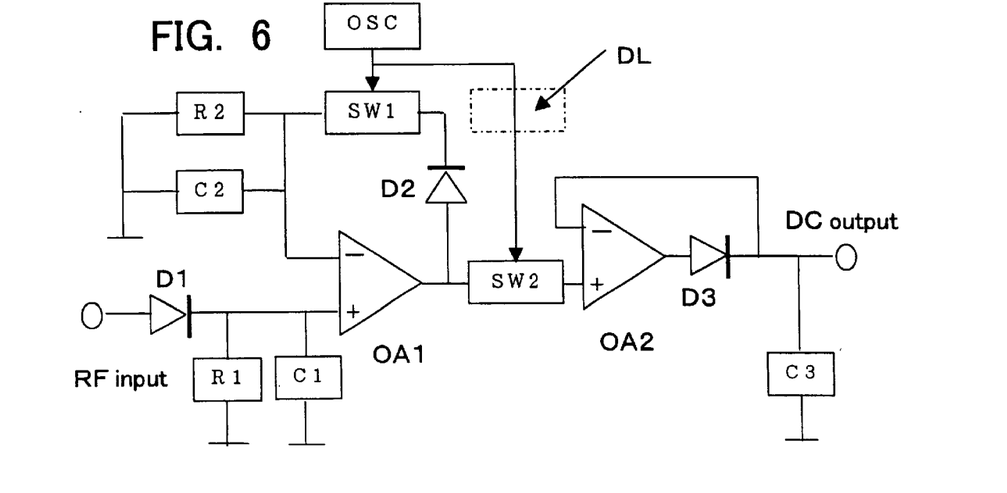
FIG. 6 is a diagram showing a first embodiment of the present invention.

FIG. 6 shows a first embodiment of the present invention. The feature of the FIG. 6 embodiment is attributable to the deficiency of the diode detection circuit of FIG. 2 in which the detection diode D1 allows a flow of a half-cycle or surge current SC whereas a direct current flows through the compensation diode D2.

Therefore, the circuit of FIG. 6 in accordance with the present invention is configured so as to allow the half-cycle or surge current to flow through the compensation diode D2.

To this end, a first switch SW1 is interposed between the compensation diode D2 and the minus terminal of the operational amplifier OA1, the first switch SW1 being on-off controlled by the output from an oscillator OSC.

The on-off control of the switch SW1 is provided such that the ratio of conduction time to non-conduction time of the compensation diode D2 becomes equal to that of the detection diode D1. That is, in FIG. 6, electric current flowing through the detection diode D1 results in a surge current SC as depicted in FIG. 5. Thus, in the circuit of FIG. 6, to ensure that electric current flowing through the compensation diode D2 is also a surge current, the first switch SW1 is on-off operated by the oscillator OSC.

That is, by correspondingly causing the frequency of the input high-frequency signal and the product of the capacitor C1 and the resistor R1 to conform to the switching frequency of the first switch SW1 and the product of the capacitor C2 and the resistor R2, respectively, it is possible to make the ratio of the peak current to the mean current of the detection diode D1 equal to the ratio of the peak current to the mean current of the compensation diode D2.

Figure 7A:
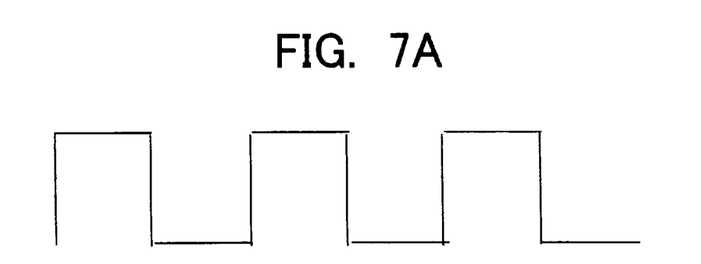
FIGS. 7A and 7B are diagrams showing an example of a duty waveform of the oscillator OSC output of FIG. 6.
Figure 7B:
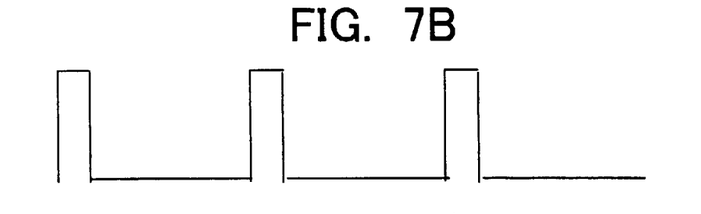

Referring to FIGS. 7A and 7B, duty waveforms of the output of the oscillator OSC are shown by way of example, with FIG. 7A depicting a duty 50% waveform and FIG. 7B depicting a duty 17% waveform. In this manner, by controlling the duty of the output of the oscillator OSC, it is also possible to provide a control of the switching period of the switch SW2.

Thus, due to the flow of the half-cycle or surge current through the compensation diode D2 similarly to the detection diode D1, the embodiment circuit shown in FIG. 6 achieves the same effective forward voltage in both the detection diode D1 and the compensation diode D2, with the result that an ideal rectifying voltage, i.e., detection output is acquired.

In FIG. 6, a holding circuit for holding the positive peak value is made up of a second operational amplifier OA2 that is connected via the second switch SW2 to the first operational amplifier, a diode D3 and a capacitor C3.

When the first switch SW1 is opened, the voltage at the minus terminal of the first operational amplifier OA1 sags and the output voltage goes high, making it difficult to intactly output the voltage. For this reason, in order to output a voltage at which the compensation diode D2 is put in its operative condition to the second operational amplifier OA2, the second switch SW2 is put into conduction in synchronism with the first switch SW1.

More specifically, when the first switch SW1 is closed, electric current flows through the compensation diode D2, producing the same condition as the case of flow of current through the detection diode D1. The voltage at that time is applied via the second switch SW2 to the second operational amplifier OA2 and is charged into the capacitor C3 by way of the third diode D3 so that the voltage is held.

Figures 8, 9A:
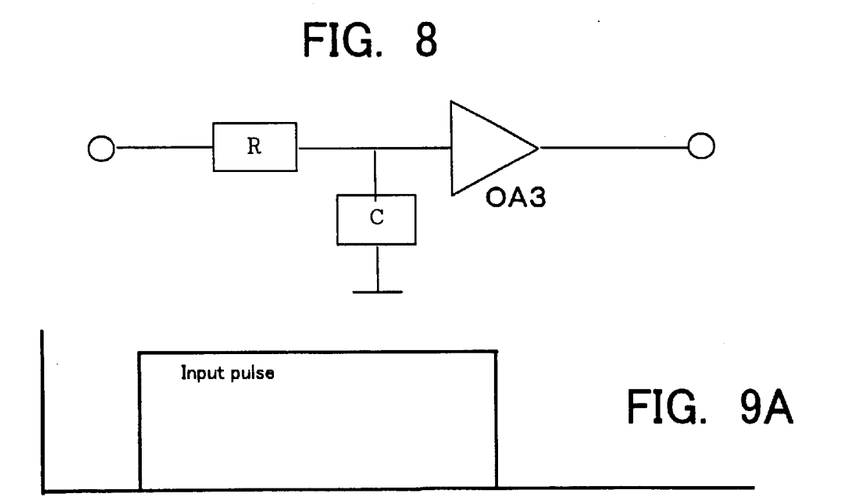
FIG. 8 is a diagram showing an embodiment of a delay circuit DL of FIG. 6.
FIGS. 9A and 9B are diagrams showing the relationship between the delay circuit threshold value and the delay.

Referring to FIG. 8, a delay circuit DL is shown which intervenes between the oscillator OSC and the second operational amplifier OA2 in FIG. 6, the delay circuit being formed of an operational amplifier OA3 having at its input side an integration circuit that consists of a resistor R and a capacitor C.

Even though the first switch SW1 and the second switch SW2 accept the same drive signals, they may possibly have different operation time. Therefore, to ensure that the switch SW2 can securely operate after the operation of the switch SW1, the delay circuit DL is interposed between the oscillator OSC and the second switch SW2.

Figure 9B:
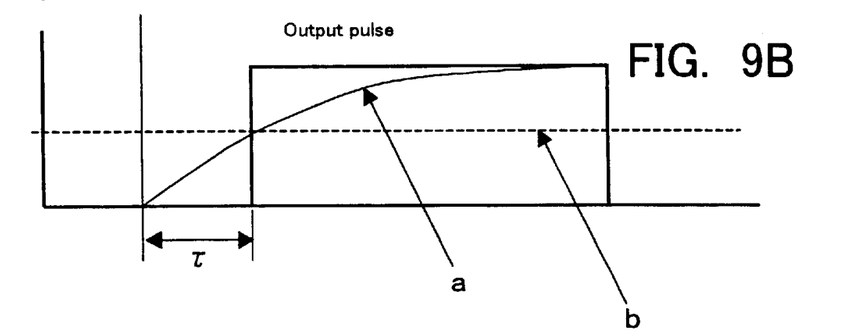

FIG. 9 illustrates the relationship between an input pulse and an output pulse of the delay circuit DL. The input pulse (FIG. 9A) is integrated by a CR integration circuit (a), and when the input pulse exceeds a predetermined threshold value b, the output pulse is acquired from the operational amplifier OA3. The delay time τ can thus be adjusted by varying the threshold value b.

Figure 10:
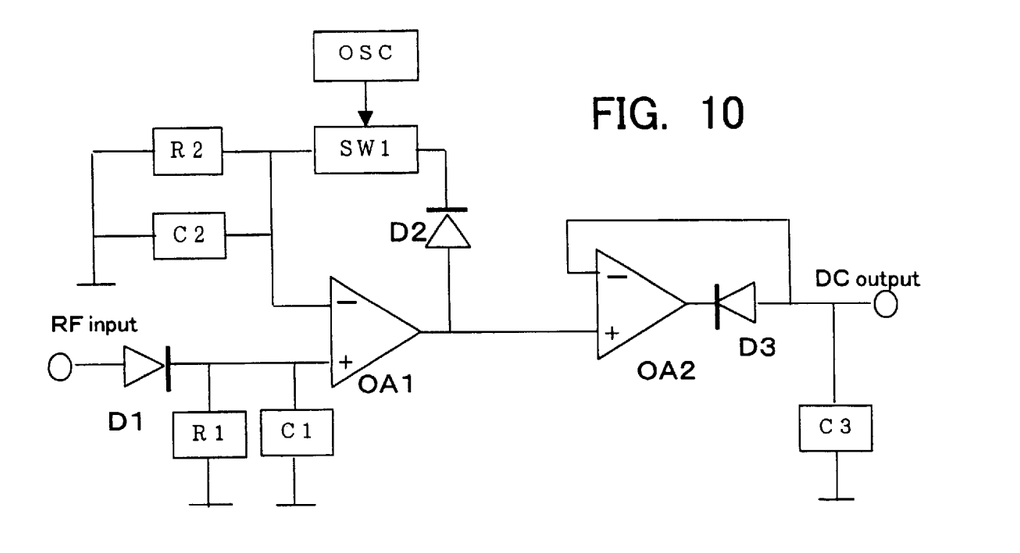
FIG. 10 is a diagram showing an example of another diode detection circuit of the present invention.

FIG. 10 shows a diode detection circuit in accordance with a second embodiment of the present invention. The feature of the circuit of FIG. 10 lies in that the FIG. 6 embodiment circuit comprises a circuit for holding the negative peak value in place of the holding circuit for holding the positive peak value.

Figure 11A:
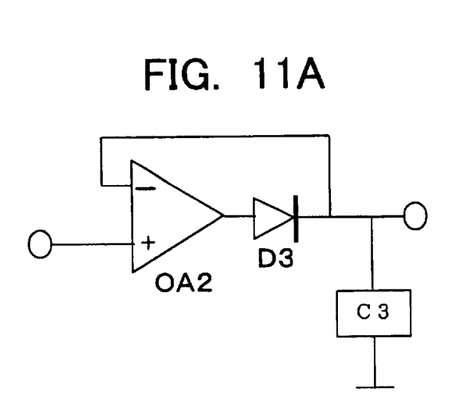
FIGS. 11A and 11B are diagrams showing examples of positive and negative peak value holding circuits.
Figure 11B:
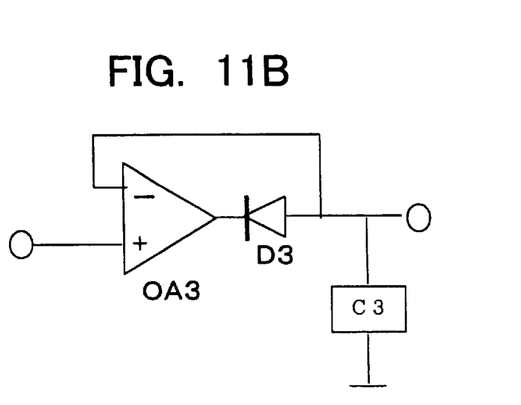

FIGS. 11A and 11B illustrate the comparison between the positive peak value holding circuit (FIG. 11A) of FIG. 6 and the negative peak value holding circuit (FIG. 11B) of FIG. 10. As is apparent from FIGS. 11A and 11B, the polarity of the peak value to be held can be selected by changing over the direction of connection of the diode D3.

The second switch SW2 may be omitted by changing over the peak value holding circuit function from positive peak to the negative peak hold as a result of use of the negative peak value holding circuit in FIG. 10 embodiment. The first switch SW1 is put into conduction so that the capacitor C3 holds the voltage in the operative condition of the second diode D2.

Figure 12:
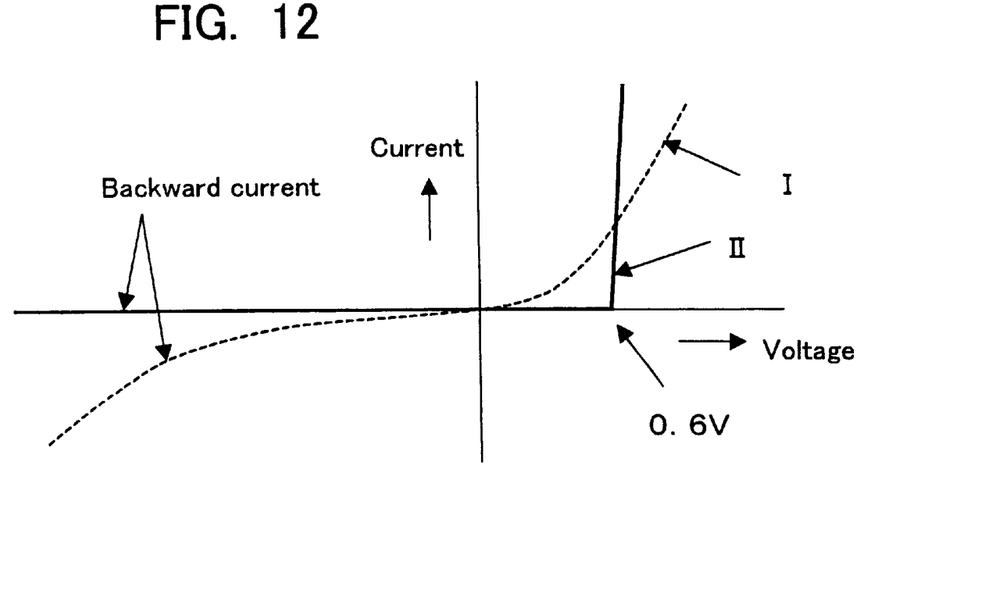
FIG. 12 is a diagram showing an example of the diode voltage-current characteristics.

Herein, FIG. 12 depicts an example of the diode voltage-current characteristics, showing a voltage-current characteristic I of a point contact diode and a voltage-current characteristic II of a silicon diode.

Figure 13:
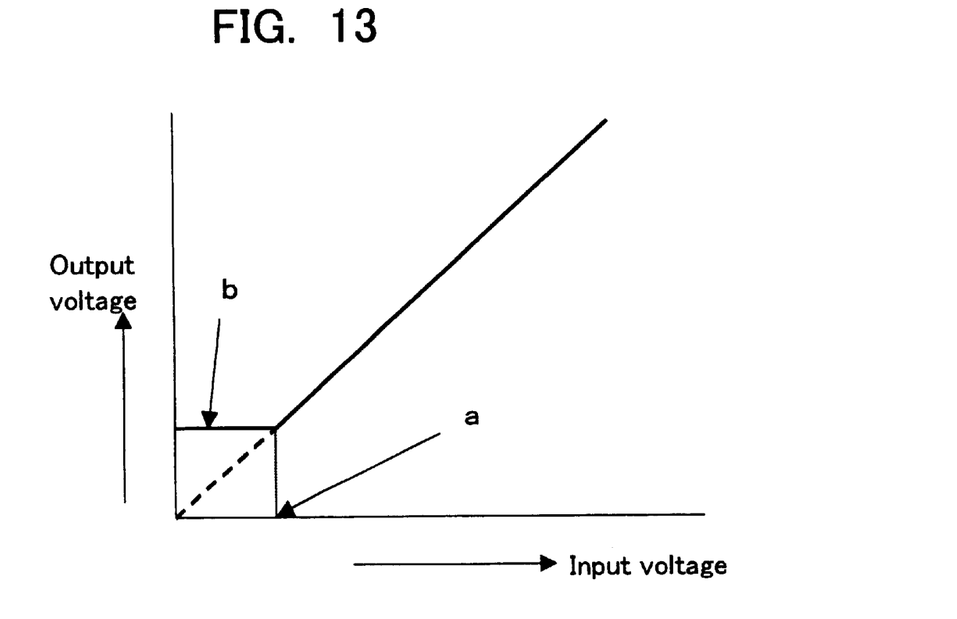
FIG. 13 is a diagram showing an input/output voltage in the case of using a silicon diode.

In the case I of the point contact diode, electric current can flow at a low voltage so that a continuous rectification is feasible from the low voltage, whereas in the case II of the silicon diode, remarkably less (substantially no) current flows at a low voltage equal to or below the forward voltage, with the result that at the forward voltage (FIG. 13, a) or below, the input voltage does not conform to the output voltage as depicted in FIG. 13 (FIG. 13, b).

To solve this problem, a positive power source is provided in series with the signal source and a voltage slightly above the forward voltage is applied thereto so that a continuous rectification output can be obtained from zero input voltage.

Figure 14:
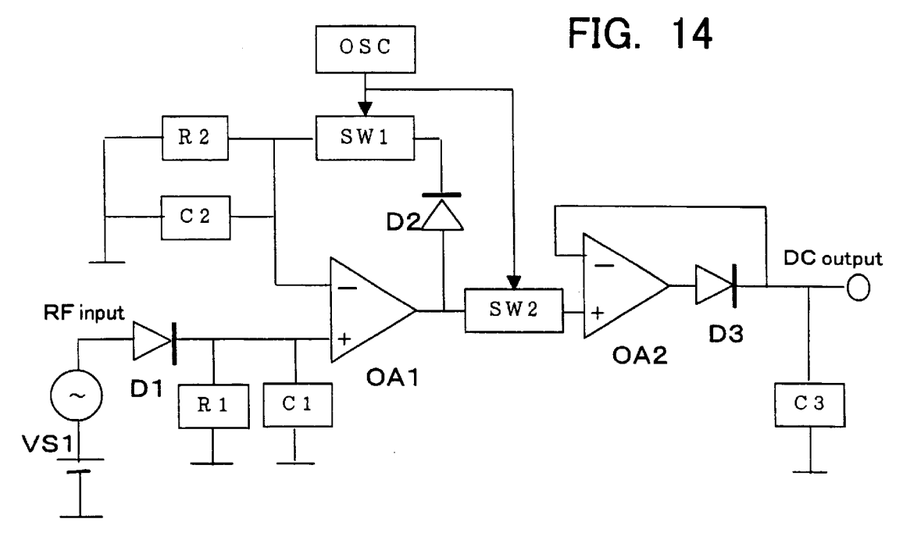
FIG. 14 is a diagram showing an example of a further diode detection circuit of the present invention.

FIG. 14 shows a further embodiment in accordance with the present invention, in which the first embodiment circuit of FIG. 6 further comprises a positive power source VS1 connected in series with a diode D1 and exceeding the forward voltage of the diode D1.

Figure 15:
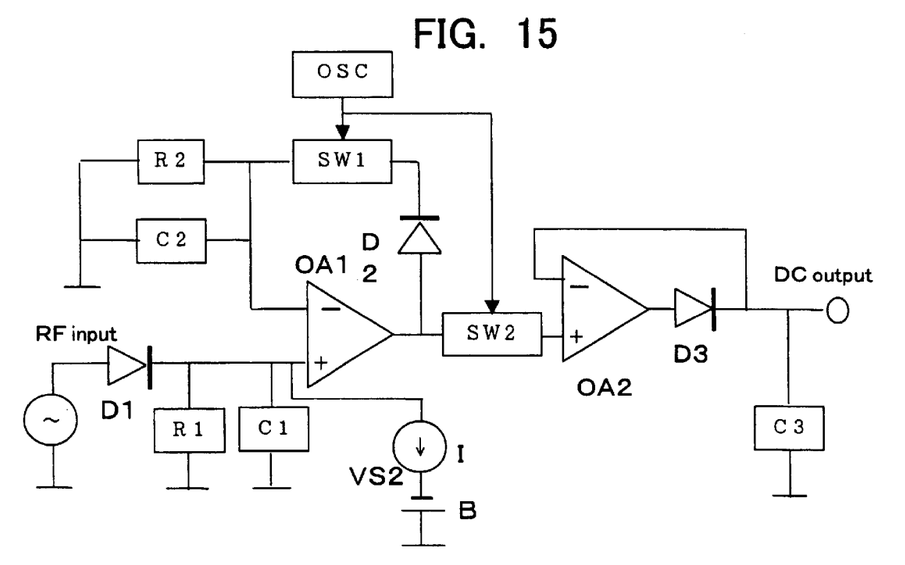
FIG. 15 is a diagram showing an example of a yet further diode detection circuit of the present invention.

FIG. 15 shows a still further embodiment in accordance with the present invention, in which the FIG. 6 embodiment circuit further comprises a negative power source and current source VS connected to the plus terminal of the operational amplifier OA1 and exceeding the forward voltage of the diode D1. The current value may be of the order of several tens of microamperes, and the current source I may be substituted with a resistor by setting the voltage B of the negative power source VS2 to a somewhat large value.

Figure 16A:
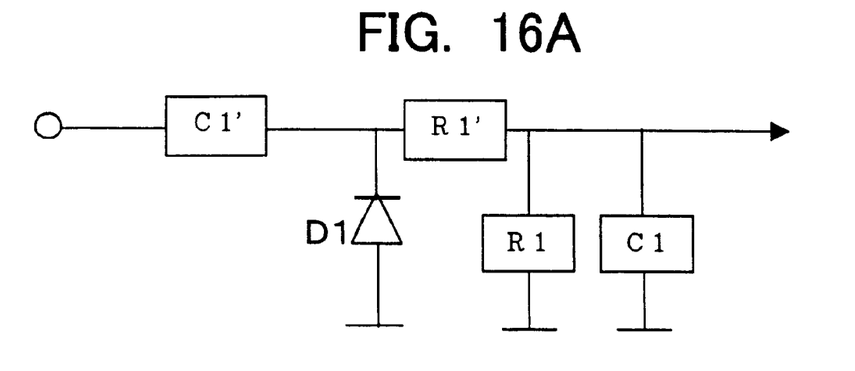
FIGS. 16A to 16C are diagrams showing examples of mode of the diode detection circuit which is applied to the present invention.
Figure 16B:
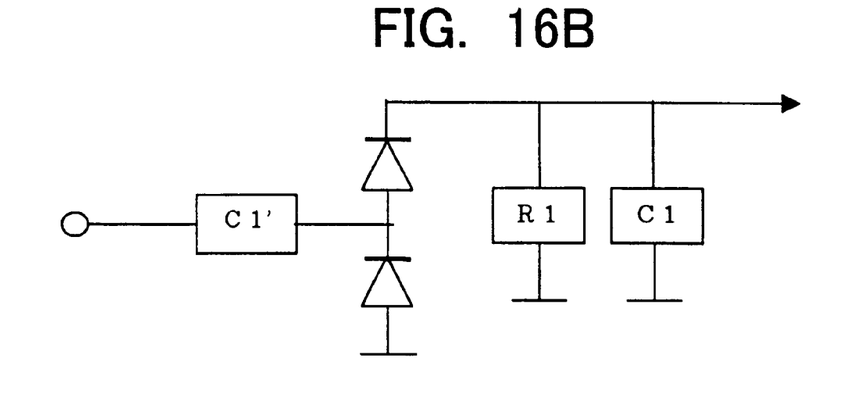
Figure 16C:
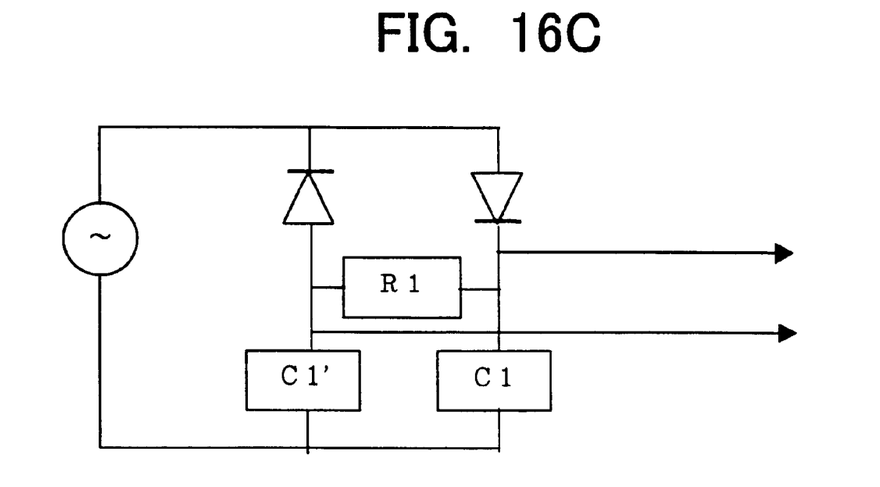

FIGS. 16A to 16C illustrate some modes of the rectifying circuit which is applied to the above embodiments.

FIG. 16A depicts a mode in which the diode D1 is disposed in parallel with the signal source. FIG. 16B depicts a mode of a voltage doubler rectifier. FIG. 16C shows an example of mode of a full-wave voltage doubler rectifier.

In FIG. 16A, a series resistor R1' needs to be sufficiently large relative to the signal source but sufficiently small relative to a parallel resistor R1. The resistor R1' may be replaced with a high-frequency coil (RFC) to present superior results.

According to the present invention, as set forth hereinabove by way of the presently preferred embodiments in light of the accompanying drawing, an ideal rectification voltage can be obtained even at a minute input high-frequency voltage.

What is claimed is:

1. A diode detection circuit comprising:
   a first diode that accepts an AC signal;
   a first parallel circuit consisting of a resistor and a capacitor, the first parallel circuit accepting a detection output from the first diode;
   a first operational amplifier having a positive input terminal that accepts a charging voltage for the capacitor of the first parallel circuit;
   a second diode that accepts an output from the first operational amplifier;
   a first switching circuit consisting of a first switch and an oscillator, the first switching circuit providing a control of the ratio of conduction to non-conduction of the first and second diodes;
   a second parallel circuit consisting of a resistor and a capacitor, the second parallel circuit accepting an output from the first switching circuit, with a charging voltage for the capacitor of the second parallel circuit being applied to a negative input terminal of the first operational amplifier; and
   a holding circuit that holds an output from the first operational amplifier.

2. The diode detection circuit according to claim 1, further comprising:
   a second switching circuit disposed on the input side of the holding circuit, the second switching circuit effecting its switching operations alternately with the first switching circuit, and wherein
   the holding circuit holds a positive peak value of the output from the first operational amplifier.

3. The diode detection circuit according to claim 1, wherein the holding circuit holds a negative peak value of the output from the first operational amplifier.

4. The diode detection circuit according to claim 1, further comprising:

a positive power source exceeding in the forward direction of the first diode.

5. The diode detection circuit according to claim 1, further comprising:

a negative power source connected to a positive input terminal of the first operational amplifier, the negative power source exceeding in the forward direction of the first diode.

6. The diode detection circuit according to claim 1, wherein the first switching circuit causes the second diode conduction time to approximate the first diode conduction time.

7. The diode detection circuit according to claim 1, wherein the resistors of the first and second parallel circuits have the same resistance value or approximate resistance values, and wherein the ratio of the peak value of the charging current to the mean value of the discharging current of the first diode conforms to the ratio of the peak value of the charging current to the mean value of the discharging current of the second diode by causing the product of the resistor, capacitor and the input frequency of the first parallel circuit to conform to the product of the resistor, capacitor and the oscillator frequency of the second parallel circuit.

* * * * *